United States Patent

Hatley et al.

[11] Patent Number: 5,650,579
[45] Date of Patent: Jul. 22, 1997

[54] MINIATURE AIR GAP INSPECTION CRAWLER

[75] Inventors: Kenneth J. Hatley; Richard M. Hatley, both of Madison, N.J.

[73] Assignee: General Electric Company, Schenectady, N.Y.

[21] Appl. No.: 567,660

[22] Filed: Dec. 5, 1995

[51] Int. Cl.$^6$ ...................................................... H04N 7/18
[52] U.S. Cl. .......................................................... 73/865.8
[58] Field of Search .......................... 73/865.8, 12.01, 73/12.09, 622, 623; 324/219–221; 348/82–85

[56] References Cited

U.S. PATENT DOCUMENTS

| | | | |
|---|---|---|---|
| 4,194,218 | 3/1980 | Hasegawa | 348/84 |
| 4,560,931 | 12/1985 | Murakami et al. | 73/623 |
| 4,569,230 | 2/1986 | Asty et al. | 73/623 |
| 4,722,001 | 1/1988 | Rohrich et al. | 348/84 |
| 5,481,929 | 1/1996 | Kohlert et al. | |

FOREIGN PATENT DOCUMENTS 26256  2/1983  Japan ..................................... 324/220

OTHER PUBLICATIONS

"A Compendium of Robotic Equipment Used in Hazardous Enviroments" EPRI NP–6697, Project 2519-1, Final Report, Feb. 1990, pp. 2–28/29, 5–14/15, 5–22/23, 5–26/27, 5–30/31.

Primary Examiner—Robert Raevis
Attorney, Agent, or Firm—Nixon & Vanderhye

[57] ABSTRACT

A miniature air gap inspection crawler for in situ inspection of the generator field and stator core of a generator. The crawler has a collapsed position for insertion into the air gap of a generator and an expanded position for pressing drive modules of the crawler against the generator field and stator core. Cameras mounted on the crawler provide video images of the field and core.

15 Claims, 3 Drawing Sheets

Fig. 2

MINIATURE AIR GAP INSPECTION CRAWLER

FIELD OF THE INVENTION

The invention relates to a miniature robotic device for inserting into the air gap of a generator and performing in situ inspections of the generator field and generator stator.

BACKGROUND

A visual inspection of a generator field, stator and wedge tightness, as well as electrical testing, should be performed on a periodic basis. Conventional generator/stator inspection and testing procedures require the complete disassembly of the stator and removal of the generator field from the stator before any inspections or tests can be performed on the unit. The cost of disassembly and removal of the field, the time it takes for this process, and the dangers of field removal have led to the omission of the generator and stator examinations from outage schedules.

In situ inspections of generators have been performed employing poles, trolleys and field turning techniques. These procedures have not accomplished the inspection task in a completely satisfactory manner or with a miniature robotic device as described herein.

DISCLOSURE OF THE INVENTION

A miniature crawler designed to pass through the radial air gap between the core iron and the retaining ring permits an in situ inspection of the field and the stator core. An entrance gap of 1.125 inches is sufficient for the miniature crawler having a height of about 1.1 inches. The crawler, inserted in a collapsed position into the gap and driven by tracks to a selected axial location, is expanded by spring return pneumatic rams to the width of the air gap to keep the crawler in place at any circumferential position. Video cameras and other inspection tools attached to the crawler are used by a trained inspector to perform generator field and stator core inspections within the air gap as the crawler is driven to selected locations. Such other inspection tools could include, for example, devices for checking stator core wedge tightness, core lamination insulation defects and the air vent slots.

Full inspection coverage of the stator core inside diameter and the field surface is facilitated by the crawler's maneuverability in the air gap. High resolution cameras mounted on the crawler provide a clear view of the stator core laminations, stator wedges, field wedges and the inboard ends of the retaining rings. A trained inspector is easily able to detect loose stator wedges, sparking, core lamination damage due to foreign object damage, motoring and hot spots, field wedge arcing and surface heating damage.

Information gathered through an in situ inspection assists in determining if field removal is necessary. The miniature air gap inspection crawler is easily used as a generator maintenance planning tool to identify parts and work scope for major outages. The ability to do a fast inspection with the crawler following a detection of abnormal operating events allows a generator to be quickly returned to service. Quick and accurate inspections made with minimal disassembly of the generator and at a minimal cost are advantages made available by the crawler.

BRIEF DESCRIPTION OF THE DRAWINGS

FIG. 2 is a top view of the inspection crawler;

BEST MODE FOR CARRYING OUT THE INVENTION

Figure 1:
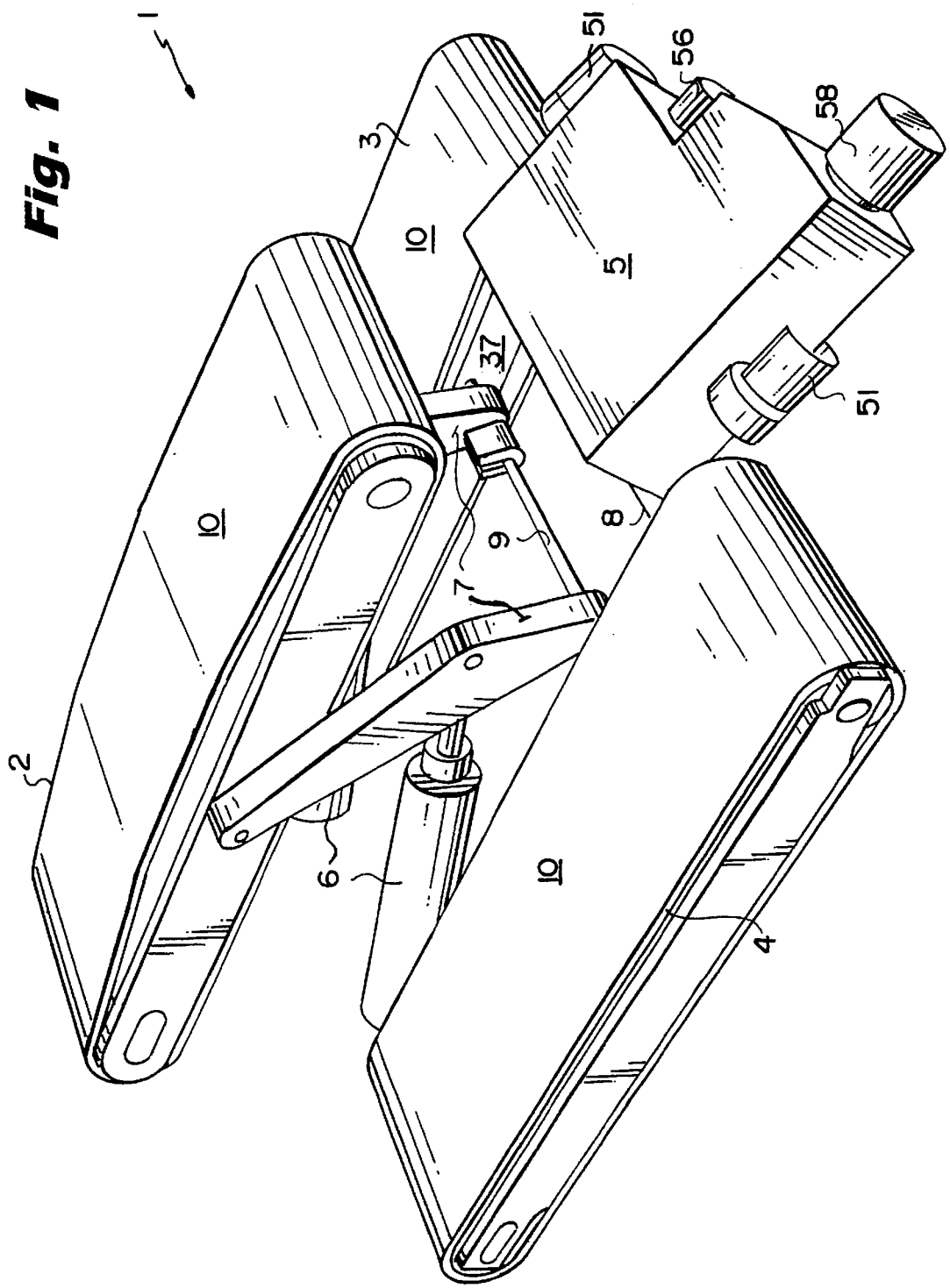
FIG. 1 is a simplified perspective sketch of the miniature air gap inspection crawler.

The miniature air gap inspection crawler 1 illustrated in a simplified form and in perspective in FIG. 1 comprises three generally similar drive modules 2, 3 and 4. Side drive modules 3 and 4 drive on the generator field through tracks 10. Center drive module 2 is adapted to drive on the stator core of the generator through its track 10. Two spring return pneumatic rams 6 pivotally attached to the side drive modules 3 and 4 permit the crawler to be expanded and collapsed by acting on link arms 7. A cross shaft 9 connects the link arms 7 together at one end and to the side drive modules 3 and 4 through yoke arms 37. At the other end link arms 7 are connected to the center drive module 2. Inspection module 5, shown here as containing cameras 56 and 58 and with side mounted lights 51, is mounted at the front of the crawler 1 on main yoke 8 that connects the two side drive modules. Inspection module 5 is mounted on the yoke 8 in a manner permitting it to be tilted so that the cameras may view the generator field.

Tracks 10 are comprised of a flexible material and extend around the outside of the drive modules 2, 3 and 4 as shown. Inner sides of the tracks 10 have teeth which engage teeth on the surface of the drive wheels and idler wheels of the drive modules. The center drive module 2 and its track 10 are wider than the side drive modules 3 and 4 and their tracks 10. The wider center drive module track prevents the wide track 10 from dropping into a stator slot.

Figure 2:
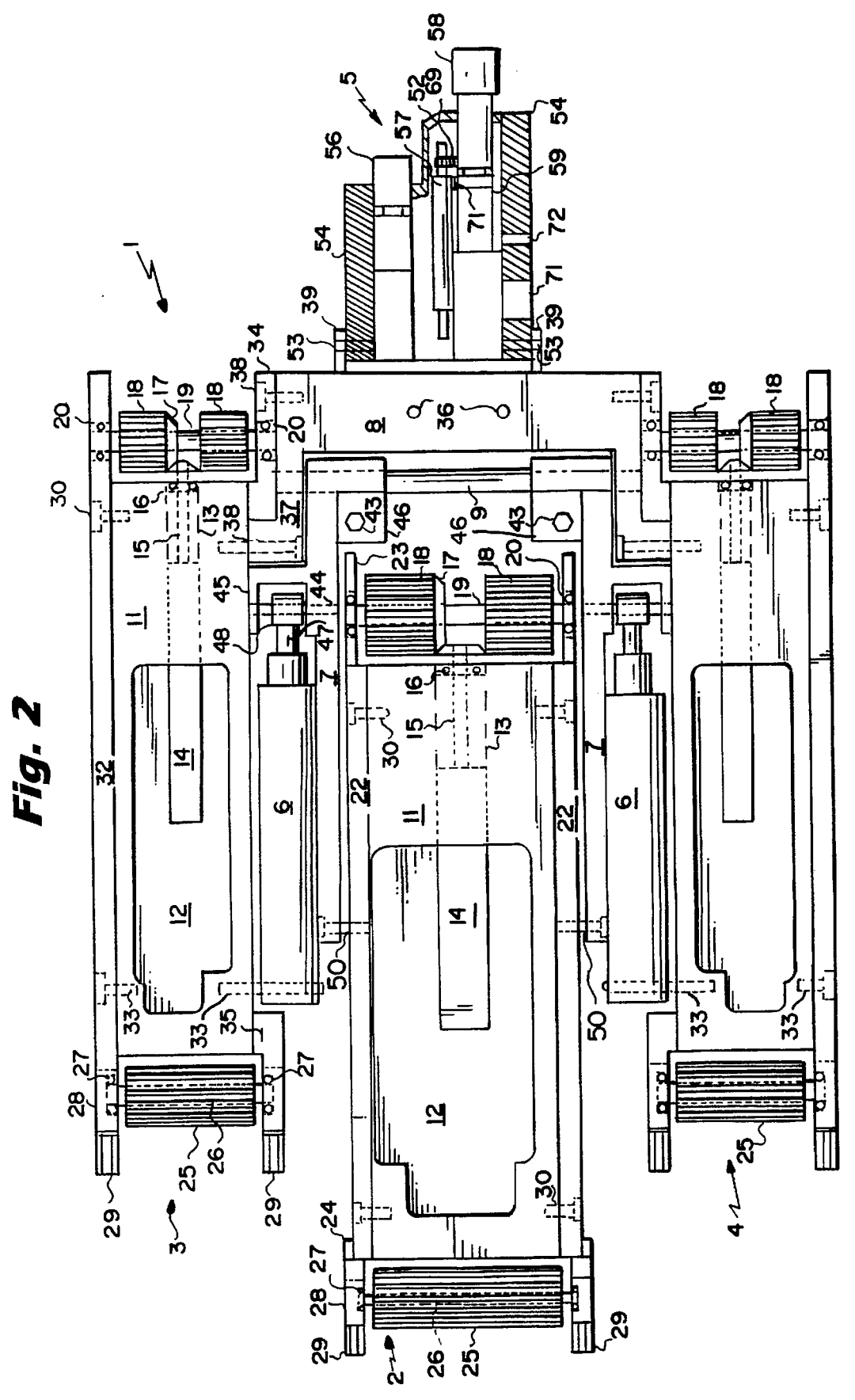

FIG. 2 is a top view of the crawler 1 illustrating the structural relationship and arrangement of the drive modules 2, 3 and 4, the ram 6 - link arm 7 arrangement for raising the center drive module 2, main yoke 8 and inspection module 5. In this view of the crawler 1, the tracks 10 have been removed from the drive modules and inspection module 5 is shown in cross section. The same numbers have been used to identify similar components of the crawler 1 and the drive modules 2, 3 and 4. Since the right side drive module 4 is a mirror image of the left side drive module 3 many of the numbers have been omitted from module 4 for purposes of clarity.

A drive module construction, with reference to center drive module 2, comprises a base plate 11 and side plates 22 secured to the base plate by bolts 30. Other means than bolts may be used as one skilled in the art would appreciate. Base plate 10 has a pocket, beneath 12, and a bore 13 for receiving drive motor module 12, motor 14, drive shaft 15 and bearing 16. The drive shaft 15 may be a unitary element or comprise a shaft coupled to the motor output shaft in a conventional manner. A drive gear of bevel gear assembly 17 is secured at the end of drive shaft 15 in driving relation to a bevel gear of gear assembly 17 secured on drive wheel shaft 19. Shaft 19 is mounted at its ends in bearings 20 secured in forward side plates 23 which are integral extensions of side plates 22. Two drive wheels 18 are mounted on the shaft 19 with the bevel gear assembly 17 in between. The drive wheels contain teeth on the circumferential surface for engaging teeth on the underside of a track 10. At the rearward end of drive module 2 an idler wheel 25 is supported on shaft 26 held in bearings 27 mounted in slidable bearing blocks 28. The bearing blocks 28 are held in slots in rear side plates 24 which are integral with side plates 22. An adjustment screw 29 is used for sliding a bearing block 28 forwardly or rearwardly to provide for adjusting the location of the idler wheel 25 with respect to the base plate 11 and thus the tension on a track 10. Idler wheel 25 has a toothed surface as illustrated.

Side drive modules 3 and 4 are similar in construction to that of center drive module 2 but differ in that they are not as wide and have only partial interior side plates, plate 34 at the forward end and plate 35 at the rearward end. In addition, side drive modules 3 and 4 have pivot shafts 33 secured to the base plate 11 and side plates 32, and providing a pivot support for pneumatic ram 6. Side plates 32 are comprised of a single plate as shown. The idler wheel 25 is also adjustable by means of screws 29 to provide for adjusting the tension on track 10.

The two side drive modules 3 and 4 are secured at the interior side to main yoke 8. In particular, base plate 11 is secured to yoke arm 37 by a bolt 38 and forward side plate 34 is secured to main yoke 8 by another bolt 38. Screws 36 in main yoke 8 are for securing the inspection module yoke 60, illustrated in FIG. 4. Struts 39 extend forwardly from main yoke 8 for pivotally holding the inspection module 5. Struts 39 may be alternatively comprised of a U-shaped bracket secured to the front of main yoke 8.

Pneumatic rams 6 and link arms 7 are assembled between center drive module 2 and side drive modules 3 and 4 in a manner that permits the center drive module 2 to be raised with respect to side drive modules 3 and 4. A link arm 7 includes a pin flange 45 and a clamping plate 46. Link arms 7, of the configuration illustrated, are secured to the center drive module side plates 22 by means of screws 50 in a manner that allows a link arm to pivot on the screw. At the forward end of the link arms 7, clamp plates and clamping bolts 43 clamp the link arms to cross shaft 9. The ends of cross shaft 9 are disposed in bores of yoke arms 37 in a manner that permits the cross shaft 9 to rotate. Clamping the link arms 7 to cross shaft 9 ensures that the center drive module 2 is kept from becoming skewed while being raised to the elevated position. Piston rod 47 of pneumatic ram 6 is connected to the link pin 44 of link arm 7 by coupling 48. Link pin 44 is secured between link arm 7 and pin flange 45.

Figure 5:
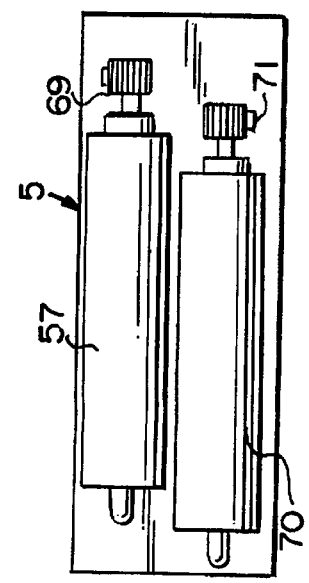
FIG. 5 is a partial side cross section showing drive motors in the inspection module.

Inspection module 5, as shown in FIG. 2, contains a forward view camera 56 of fixed focus, a side view camera 59 that is remotely focused, rotating prism 58 and a drive motor 57 stacked over a focus drive motor 70 as illustrated in FIG. 5. Gear 69 on the drive shaft of motor 57 rotates prism 58. Gear 71 is on the drive shaft of motor 70 and drives the focus adjust mechanism of camera 59. Side wall members 54 are side walls of the inspection housing and receive pivot pins 53 which permit the module 5 to tilt in a downward direction. Side wall member 52 is the front wall of the inspection module housing. Element 73 is the opening for an electrical connector and element 72 is an opening for a pneumatic air line connector. Lights 51 as illustrated in FIG. 1, but not shown in FIG. 2, are attached to side wall members 54.

Figure 3:
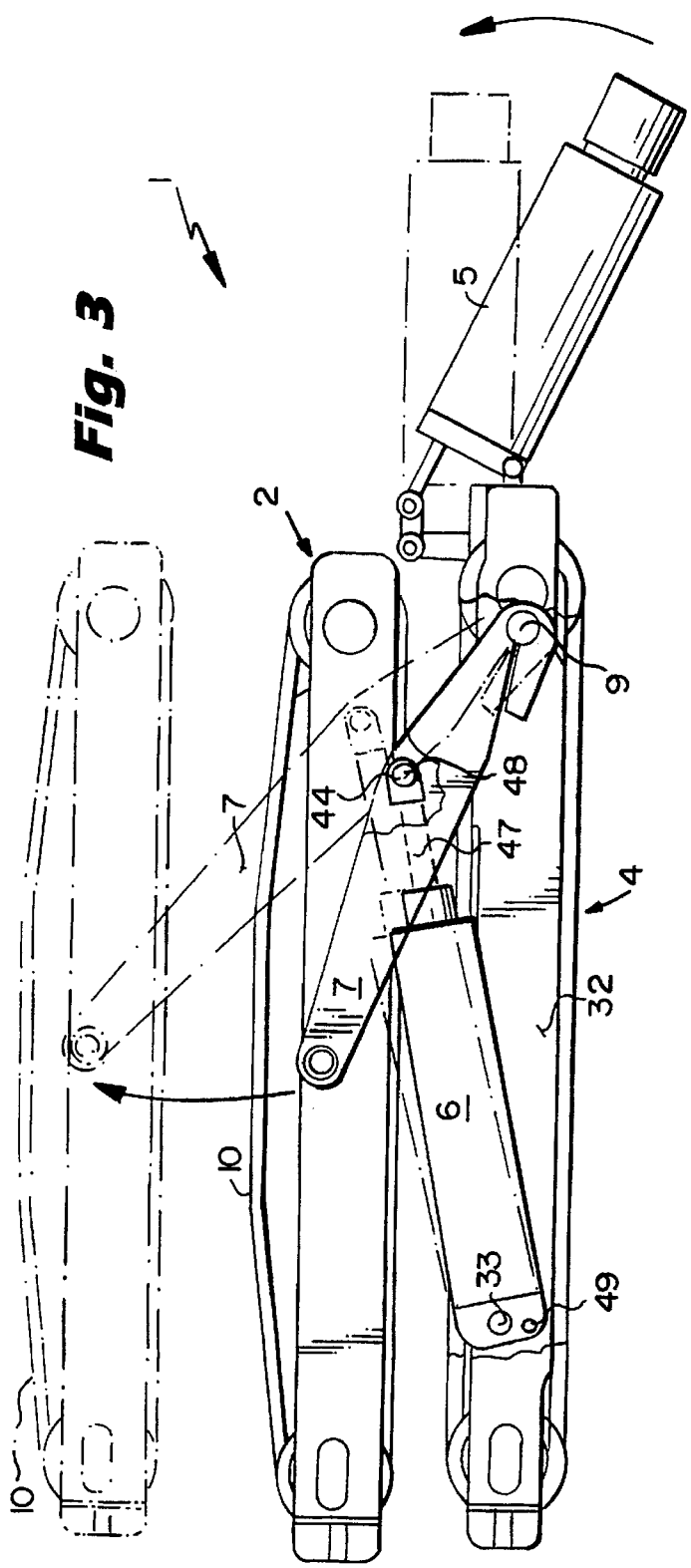
FIG. 3 shows the crawler in its collapsed position and expanded position and the tilting motion of the inspection module.

Pneumatic rams 6 are of the spring return type and are operated by air supplied through pneumatic lines (not shown) attached to air inlet port 49 shown in FIG. 3. As further illustrated in FIG. 3, a piston rod 47 of pressurized rams 6 acts on a link arm 7 via coupling 48 and link pin 44 to raise the center drive module 2 to an elevated position, shown in dotted lines, where its track 10 contacts and presses against the inside diameter of the stator core. The dotted link arm 7 is illustrated as being elongated but this is only to facilitate the showing of the raising of the center drive module 2. In FIG. 3, side drive module 4 is cut away to show the right ram 6 and link arm 7. Link arm 7 is cut away at the center to illustrate the coupling 48. Once the center drive module is raised to the elevated position, sufficient air pressure is supplied and maintained to the pneumatic rams 6 to force the side drive modules 3 and 4 against the generator field and the center drive module 2 against the stator core to hold the crawler 1 in place, even at vertical, 90 or 270 degree, positions and an inverted, 180 degree, position in the generator air gap. Return springs (not shown) of the spring return pneumatic rams 6 provide the crawler 1 with the capability of being collapsed in the event of a failure. By simply removing the supply of air to the pneumatic rams 6, drive module 2 retracts from its elevated position, and the crawler 1 in its collapsed position is easily retrieved from a generator air gap.

Each of the motors 14 in the drive modules is a reversible servo motor individually controlled at a computer control console. The motors have the capability of driving the crawler at speeds of up to 30 inches per minute. The speed of each motor 14 is controlled through a motion control program at the computer console.

To ensure accurate tracking in an axial run where the crawler 1 travels in the axial direction along the air gap of a generator, the crawler 1 is expanded and the center drive module 2 is in contact with the stator core and is driven at the same speed and in the opposite rotational direction to the side drive modules 3 and 4. When crawler 1 is running in a circumferential direction, the crawler 1 is expanded and the center drive module 2 is in contact with the stator core and is driven slightly faster and in the opposite rotational direction to side drive modules 3 and 4 in contact with the field in order to compensate for the greater diameter of the stator core. In order to turn the crawler 1, the speed between the left and right side drive modules 3 and 4 is varied by driving the two modules at the same speed but in opposite directions which causes the crawler 1 to pivot about the contact point of the center core-contacting module. While the field side drive module tracks 10 are turning in opposite directions to turn the expanded crawler, the center core-contacting module track 10 can be oscillated forward and backward to reduce friction in making the turn.

Figure 4:
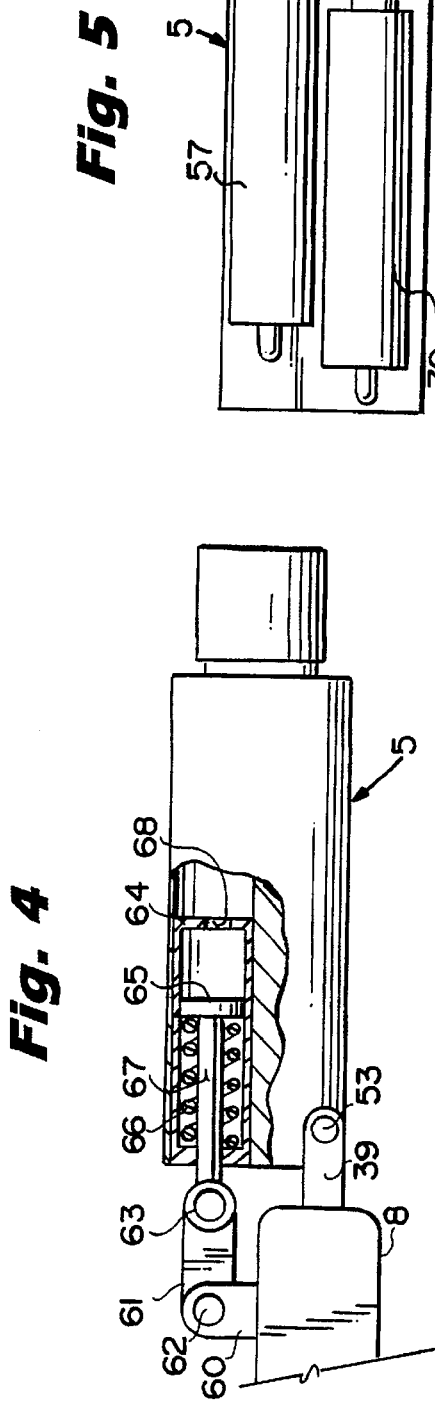
FIG. 4 shows further details of the mechanism for tilting the inspection module.

As clearly illustrated in FIG. 4, the camera module 5 is supported on each side by a strut 39 and a pivot pin 53. A spring 66 of spring return pneumatic air ram 64 keeps the module 5 in a generally horizontal position through its action on piston 65, piston rod 67, pivot coupling 63, link 61, shaft 62 and inspection module yoke 60. The application of air at air inlet 68 moves the piston 65 against the spring 66, compressing it, which permits the module 5 to tilt downwardly with respect to the axis of main yoke 8 by pivoting on pins 53. Control of the air pressure can control the degree of the tilt. The controlled tilting capability of the inspection module 5 makes for improved viewing when the crawler 1 is moving in the circumferential direction in a generator air gap.

Camera 56 is, in the preferred embodiment, a high resolution, ⅓ inch, color CCD forward view camera with a field of view of approximately 50 degrees and a fixed focus for straight ahead viewing. It is used both for navigating the crawler through an air gap and making inspections. Camera 59 is a side view camera with prism 58 which rotates 360 degrees and is primarily used for detailed inspection of the stator core, generator field and retaining ring faces. Camera 59 has a remotely controlled power focus and, in the preferred embodiment, is a high resolution, ⅓ inch, color CCD camera with a field of view of approximately 30 degrees. Rotation of the prism 58 and the focus of the camera 59 are by remote control of motors 57 and 70, respectively, at the computer control console.

FIG. 5 illustrates the stacked electrical motors 57 and 70 in the inspection module 5. Upper motor 57 is coupled via gear 69 to rotate prism 58. Lower motor 70 via its gear 71 drives the focus mechanism of camera 59.

Prior to performing an inspection, crawler 1 is compressed to its collapsed position as illustrated by the solid lines in FIG. 3. In this position the unit is about 1.1 inches high, 9½ inches long and 8½ inches wide. The camera module is about 0.9 inches high, 3 inches long and 2½ inches wide. As shown in FIG. 2 center module 2 extends to the rear of the crawler 1 and camera module 5 is positioned forwardly.

An umbilical which includes electrical cables, pneumatic lines and a tether line is attached to the crawler. The electrical lines are connected to a computerized motion control system for control of the crawler as one skilled in the art of motion control understands.

The crawler 1 in its collapsed position is inserted in a generator air gap at the 12 o'clock position and driven in the axial direction to a desired location, using the view from camera 56 as a navigation aid. Upon reaching a desired location in the air gap, the crawler is expanded by supplying air through attached air lines to pneumatic rams 6. Spring return pneumatic rams 6 are of the same construction as ram 64. The computer motion control system is used by an inspector to drive the crawler 1 to the necessary inspection points while the supply of air to pneumatic ram 64 through an attached air line can be controlled to achieve a desired tilt of the inspection module 5.

Crawler 1 is normally retrieved from the generator air gap by driving it out. However, in the event of a motor failure, power failure or other situation that causes the crawler to become immobile, the crawler can easily be retrieved manually. Air pressure to the spring return pneumatic rams 6 is released and after the crawler collapses to its collapsed position it is pulled out by the tether line.

The miniature air gap inspection crawler permits inspection of the generator field and stator core with minimal disassembly of the generator, single ended entry into the generator and no rotation of the generator field. The views provided by the cameras allow a trained inspector to easily determine the maintenance procedures that need to be instituted and can be used to provide a history of the generator.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A miniature air gap inspection device comprising, first and second spaced apart side drive modules, a center drive module disposed between said side drive modules, said center drive module being coupled to each of said side drive modules by a link arm permitting the center drive module to be raised and lowered with respect to the side drive modules, wherein said first, second and center drive modules each include a track for driving on a generator field or stator core, and an inspection module mounted on at least one of said drive modules.

2. A miniature air gap inspection device as in claim 1 wherein each drive module includes a reversible, variable speed drive motor whereby each drive module is independently driven.

3. A miniature air gap inspection device as in claim 2 wherein each track is a toothed track and is driven by toothed drive wheels driven by one of said drive motors.

4. A miniature air gap inspection device as in claim 3 wherein each said drive module includes a toothed idler wheel in contact with a track and means for adjusting the position of the idler wheel to adjust track tension.

5. A miniature air gap inspection device as in claim 2 wherein the variable drive motor of the center drive module is operable in an oscillating manner during turning maneuvers.

6. A miniature air gap inspection device as in claim 1 wherein each said drive module includes an electrical drive motor, a gear assembly coupled to the drive motor and a pair of wheels driven by the gear assembly for engaging said track.

7. A miniature air gap inspection device as in claim 1 further comprising pneumatic rams coupled to said side drive modules for acting on the link arms to raise the center drive module to an elevated position.

8. A miniature air gap inspection device as in claim 7 further comprising a cross shaft connecting said link arms together.

9. A miniature air gap inspection device as in claim 7 and including a main yoke connecting said first and second drive modules together and a cross shaft connecting the link arms to said main yoke.

10. A miniature air gap inspection device as in claim 9 wherein said inspection module is pivotally coupled to said main yoke and includes means in said inspection module attached to said main yoke for permitting the controlled pivoting of said inspection module.

11. A miniature air gap inspection device as in claim 1 wherein said inspection module comprises a camera.

12. Apparatus for in situ inspecting a generator air gap comprising, a miniature crawler collapsible to a height less than the width of the generator air gap to be inspected and expandable to a position having a height greater than the width of the air gap and comprising drive members which press against a generator field and stator core defining the air gap in the expanded position, said drive members comprising motor driven tracks for driving against the generator field and stator core to propel the crawler through the air gap, at least one camera for viewing the field and the stator core carried on the miniature crawler, and a motion control system coupled to said miniature crawler for controlling said drive members.

13. Apparatus as in claim 12 wherein said miniature crawler comprises a pneumatic actuated ram and link arm subsystem coupled between the drive members for expanding the crawler to the expanded position.

14. A miniature air gap inspection device comprising, first and second spaced apart side drive modules, a center drive module disposed between said side drive modules, said center drive module being coupled to each of said side drive modules by a link arm permitting the center drive module to be raised and lowered with respect to the side drive modules, an inspection module mounted on at least one of said drive modules, wherein said inspection module is pivotally mounted on said at least one drive module by members which allow the inspection module to be tilted about an axis substantially perpendicular to an inspection module viewing axis, and a pneumatic ram for controlling the tilt of the inspection module.

15. A miniature air gap inspection device as in claim 14 wherein said pneumatic ram is a spring return pneumatic ram.

* * * * *